US007265631B2

(12) United States Patent
Kwa et al.

(10) Patent No.: US 7,265,631 B2
(45) Date of Patent: Sep. 4, 2007

(54) TRANSIMPEDANCE AMPLIFIER WITH SIGNAL AMPLIFICATION CIRCUIT THAT PERFORMS POWER SIGNAL REGULATION

(75) Inventors: Hock Tiong Kwa, Singapore (SG); Richard Kok Keong Lum, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 111 days.

(21) Appl. No.: 11/078,539

(22) Filed: Mar. 12, 2005

(65) Prior Publication Data

US 2006/0202766 A1 Sep. 14, 2006

(51) Int. Cl.
*H03F 3/08* (2006.01)

(52) U.S. Cl. .................................................... 330/308

(58) Field of Classification Search ................. 330/308
See application file for complete search history.

(56) References Cited

U.S. PATENT DOCUMENTS 4,467,191 A 8/1984 Chalfin et al.
5,412,202 A 5/1995 Sato
5,592,124 A * 1/1997 Mullins et al. ............. 330/308
6,509,574 B2 * 1/2003 Yuan et al. ................. 250/551
6,781,468 B1 * 8/2004 Robinson et al. ........... 330/308
6,801,084 B2 * 10/2004 Smith et al. .................. 330/98
6,818,879 B2 * 11/2004 Yamaguchi et al. .... 250/214 A
7,135,932 B2 * 11/2006 Quadir et al. ............... 330/308
2005/0007199 A1 1/2005 Quadir et al.

OTHER PUBLICATIONS

"A Novel CMOS Transimpedance Amplifier for DVD Application, " Sau-Mou Wu, Chung-Yuan Chen, ECCTD'03—European Conference on Circuit Theory and Design, Sep. 1-4, 2003, Cracow, Poland, pp. 233-236.

"A CMOS 18 THz ohm 240 Mb/s Transimpedance Amplifier and 155 Mb/s LED-Driver for Low Cost Optical Fiber Links," Mark Ingels, Geert Van der Plas, Jan Crols, and Michel Steyaert, IEEE Journal of Solid-State Circuits, vol. 29, No. 12, Dec. 1994, pp. 1552-1559.

* cited by examiner

*Primary Examiner*—Robert Pascal
*Assistant Examiner*—Alan Wong

(57) ABSTRACT

The transimpedance amplifier that performs signal amplification includes a first input that receives an input signal, a second input that receives a power signal, a third input that receives a control signal, and an output that generates an output signal. The transimpedance amplifier includes at least one signal amplification circuit that receives the power signal, input signal, and the control signal and that performs both signal amplification on the input signal and regulation of the power signal in response to the control signal.

17 Claims, 7 Drawing Sheets

LIGHT SENSOR (E.G., PHOTO-DETECTOR) APPLICATION 600

TRANSIMPEDANCE AMPLIFIER WITH SIGNAL AMPLIFICATION CIRCUIT THAT PERFORMS POWER SIGNAL REGULATION

BACKGROUND OF THE INVENTION

Transimpedance amplifiers are useful in many applications. One approach to designing transimpedance amplifiers (TIAs) is to directly connect the amplification stages to the power supply rail (e.g., V_CC). In this approach, the transimpedance amplifiers do not have any circuit for power supply regulation of the amplification stages. One disadvantage of these types of TIAs without power supply regulation is that the TIA exhibits poor power supply rejection.

Another approach to designing transimpedance amplifiers (TIAs) is to utilize a shunt regulator for improving the power supply rejection of the TIA. As can be appreciated, although TIA with a shunt regulator provides improved power supply rejection as compared with the first approach, additional current is needed to maintain internal supply regulation of the amplifier stages. This additional current does not contribute to the signal bandwidth of the amplifier stages and is essentially wasted in order to obtain good power supply rejection.

Another example of a design approach for TIAs is set forth in a publication entitled, "A Novel CMOS Transimpedance Amplifier for DVD Application," Sau-Mou Wu, Chung-Yuan Chen, ECCTD'03—European Conference on Circuit Theory and Design, Sep. 1-4, 2003, Cracow, Poland, pages 233-236.

One disadvantage of current three-stage transimpedance amplifier circuit architecture is that the architecture diverts current from the main transistor amplifier to the gm-connected load. Consequently, relatively more current is required to produce a required gain to satisfy performance requirements of the amplifier.

A second disadvantage of current three-stage transimpedance amplifier circuit architecture is that the architecture employs a regulator on the internal rail for noise rejection, but the regulator requires shunting additional current to ground through a separate amplifier. Consequently, this design requires more current and also requires additional circuit elements to implement the separate amplifier.

Other challenges in the design of transimpedance amplifier circuit include reducing the current consumption of the amplifier, which in turn reduces the power consumption of the circuit, while increasing the bandwidth of the transimpedance amplifier.

Based on the foregoing, there remains a need for a transimpedance amplifier with a self-biased regulator that overcomes the disadvantages set forth previously.

SUMMARY OF THE INVENTION

According to one embodiment of the present invention, a transimpedance amplifier with a self-biased regulator is described. The transimpedance amplifier that performs signal amplification includes a first input that receives an input signal, a second input that receives a power signal, a third input that receives a control signal, and an output that generates an output signal. The transimpedance amplifier includes at least one signal amplification circuit that receives the power signal, input signal, and the control signal and that performs both signal amplification on the input signal and regulation of the power signal in response to the control signal.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A transimpedance amplifier with self-biased regulator is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

According to one embodiment of the invention, transimpedance amplifier with self-biased regulator that conserves current without sacrificing bandwidth is provided.

Transimpedance Amplifier with Self-Biased Regulator 100

Figure 1:
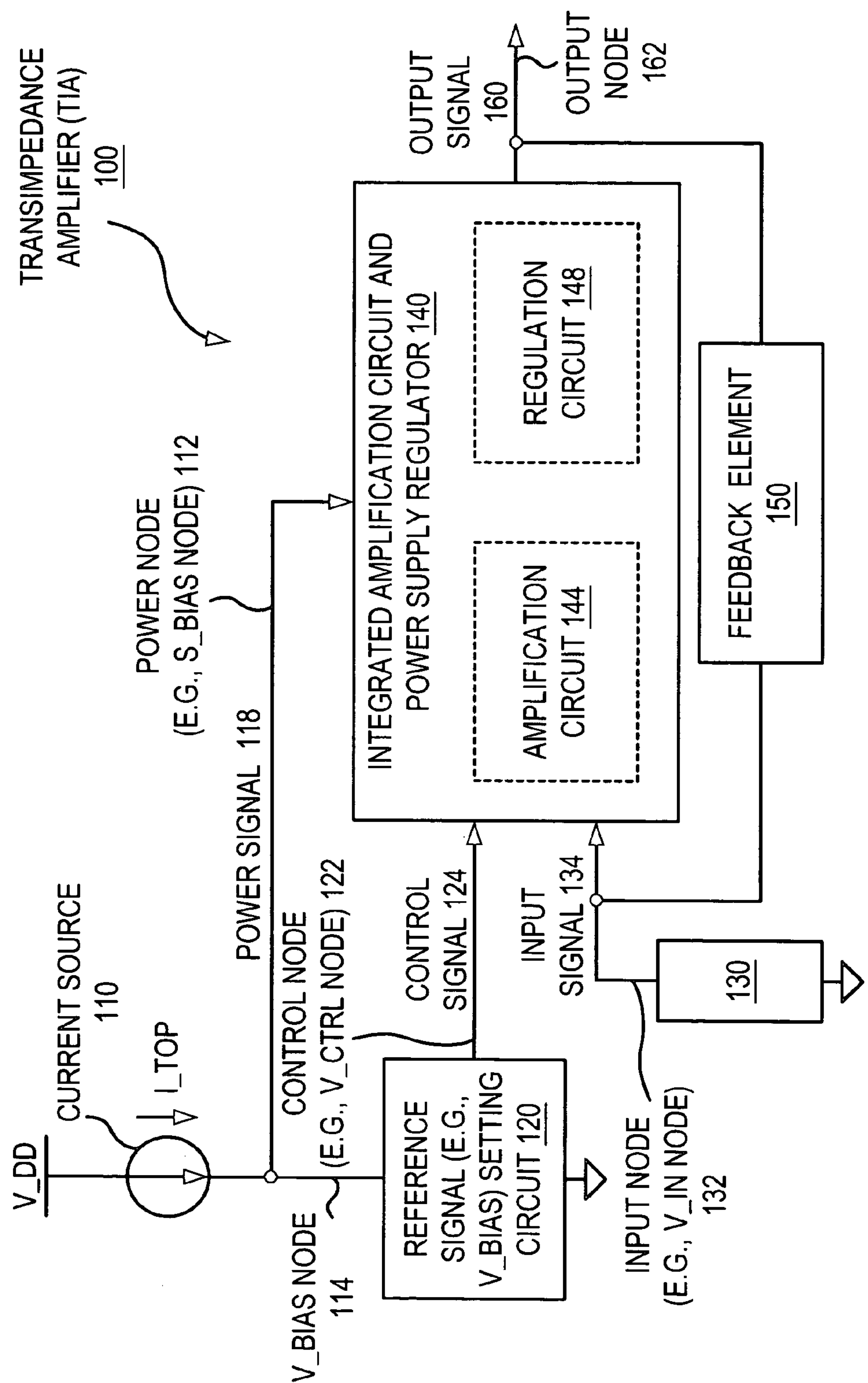
FIG. 1 illustrates a block diagram of a transimpedance amplifier according to one embodiment of the invention.

FIG. 1 illustrates a block diagram of a transimpedance amplifier (TIA) 100 according to one embodiment of the invention. The transimpedance amplifier (TIA) 100 includes a current source 110 that generates a signal (e.g., a current signal, I_top). The current source 110 includes a first electrode that is coupled to a first predetermined signal (e.g., a power signal, V_DD) and a second electrode that is coupled to a power node (e.g., a S_bias node 112).

The transimpedance amplifier (TIA) 100 also includes a reference signal setting circuit (RSSC) 120 that includes a first electrode that is coupled to a control node 122 (e.g., a V_bias node or a V_ctrl node) and a second electrode that is coupled to a second predetermined signal (e.g., a ground signal). In one embodiment, described in greater detail hereinafter with reference to FIG. 3, the S_bias node and the 112 V_bias node 122 are different nodes. In an alternative embodiment, the S_bias node 112 and the V_bias node 122 can be the same node.

The transimpedance amplifier (TIA) 100 also includes an integrated amplification circuit and power supply regulator 140. The integrated amplification circuit and power supply regulator 140 includes an amplification circuit 144 that provides signal amplification to an input signal 134 and a regulation circuit 148 that regulates the power signal 118

(e.g., by providing power supply noise rejection). It is noted that the amplification circuit 144 and the regulation circuit 148 can share one or more transistors. The transimpedance amplifier 100 also includes an output electrode that provides an output signal 160.

A feedback element 150 includes a first electrode that is coupled to the input node 132 and a second electrode that is coupled to the output node 162 of the integrated amplification circuit and power supply regulator 140.

The integrated amplification circuit and power supply regulator 140 includes a first input that receives an input signal 134, a second input that receives a power signal 118, a third input that receives a control signal 124, and an output that generates an output signal 160.

According to one embodiment, at least one signal amplification circuit (e.g., a gain stage) that receives the power signal 118, input signal 134, and the control signal 124 performs both signal amplification on the input signal 134 and regulation of the power signal 118 in response to the control signal 124.

According to one embodiment, the integrated amplification circuit and power supply regulator 140 includes a mechanism (e.g., at least one gain stage) that employs a supply signal (e.g., a current source signal, I_top) for both signal amplification and power supply signal regulation. In this regard, the transimpedance amplifier is also referred to herein as a TIA with a self-biased regulator since separate bias current is not needed to operate the regulation circuit 148.

An input element 130 includes a first electrode coupled to a predetermined signal (e.g., a ground voltage signal) and a second electrode coupled to an input node 132 that is coupled to the integrated amplification circuit and power supply regulator 140. The input element 130 can be a sensor element, such as a photodiode, a current generating sensor, or other sensing device, that generates a signal (e.g., a current signal) to be detected.

Figure 2:
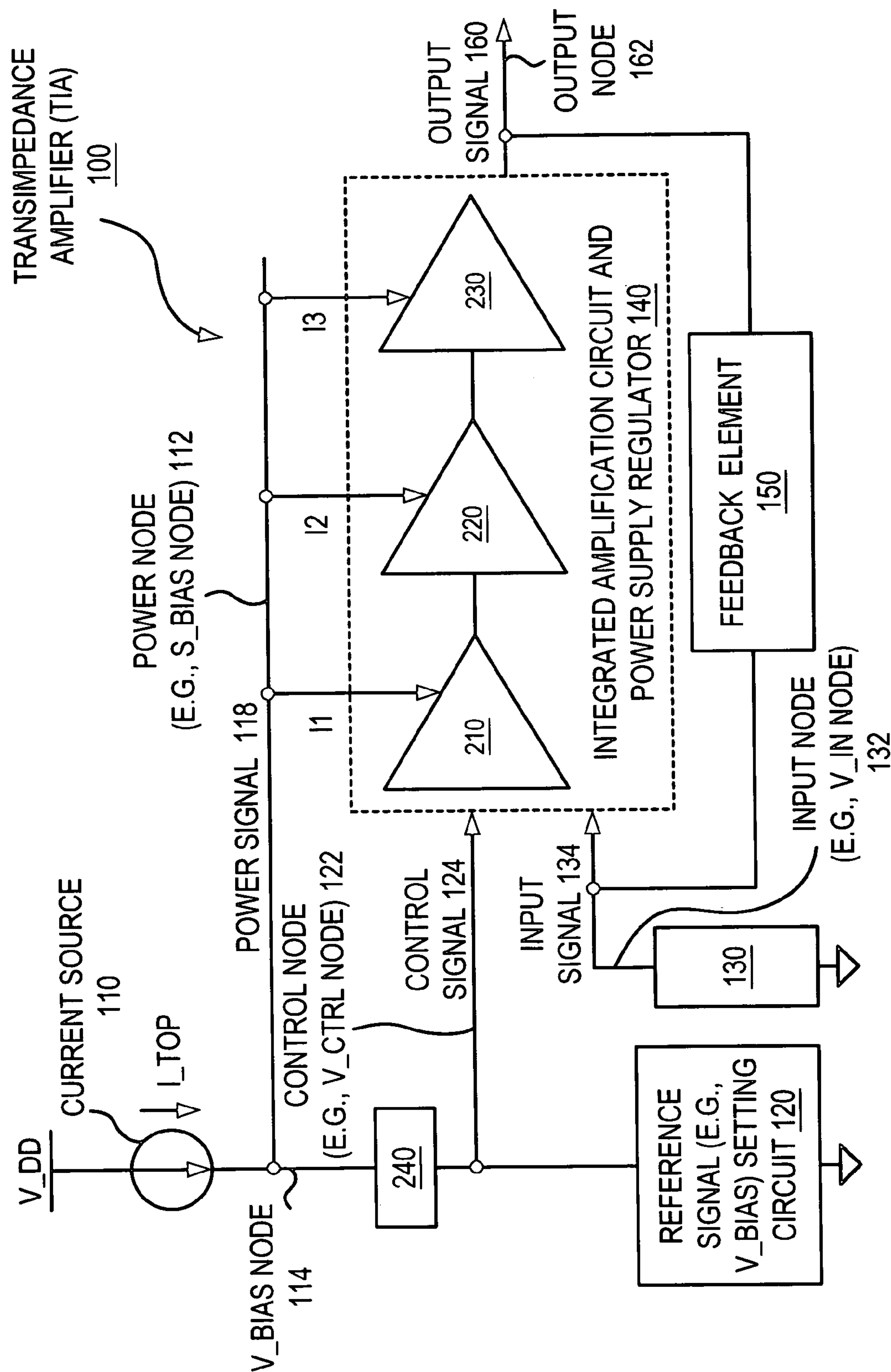
FIG. 2 illustrates in greater detail the integrated amplification circuit and power supply regulator of FIG. 1 according to a first embodiment of the invention.

FIG. 2 illustrates in greater detail the integrated amplification circuit and power supply regulator 140 of FIG. 1 according to a first embodiment of the invention. The amplification circuit 144 can include a single stage or a plurality of stages. For example, the amplification circuit 144 can have "n" stages. In one example, the transimpedance amplifier 100 includes three stages (e.g., n=3): a first stage 210, a second stage 220, and a third stage 230.

The first stage 210 can be a gain stage, and the second stage 220 can also be a gain stage. The third stage 230 can be an output stage. In one example, the output stage 230 is a class AB output stage, whose construction and operation are known to those of ordinary skill in the art. Exemplary implementation of the first stage 210, second stage 220, and the third stage 230 are described in greater detail hereinafter with reference to FIG. 3.

It is noted that the current source 110 supplies a predetermined signal (e.g., a current signal, I_top) to the stages of the transimpedance amplifier. Preferably, the current source 170 provides a high impedance to the power source, V_DD in order to improve power supply noise rejection, resulting in favorable circuit immunity to noise.

The first amplifier stage 210 is the first stage of the three-stage CMOS amplifier. The first amplifier stage 210 includes a first input that receives the input signal 134 and a second input that receives the control signal (e.g., V_CTRL) 124. The control signal, for example, can controls the current supplied to the first stage 210, the second stage 220, and the third stage 230. In one embodiment, the current required by the amplification stages varies monotonically with the control signal 124 (e.g., a control voltage signal). In one embodiment, the current that biases the amplification stages is controlled by the control signal. This current is balanced against the current supplied by I_top with the supply regulation feedback. The integrated amplification circuit and power supply regulator 140 acts or operates as a shunt regulator that is integrated with the amplification or gain stages of the transimpedance amplifier 100.

The second amplifier stage 220 is coupled to the first stage 210 and provide further signal amplification. The third stage can be implemented with a class AB output stage that provides improved load driving capability. The output (O/P) of the third stage 230 may be coupled to the input of the first stage 210 with a transimpedance feedback element 150. In one example, transimpedance feedback element 150 can be implemented with a resistor in parallel with a capacitor.

The transimpedance amplifier 100 also includes an emitter follower circuit 240. The current source 110 generates a predetermined current (e.g., I_top), which is divided among three current paths. There is, for example, a respective current through each stage of the amplifier. The predetermined current, I_top, may be divided, for example, into currents I1, I2, and I3.

Exemplary Circuit Implementation

Figure 3:
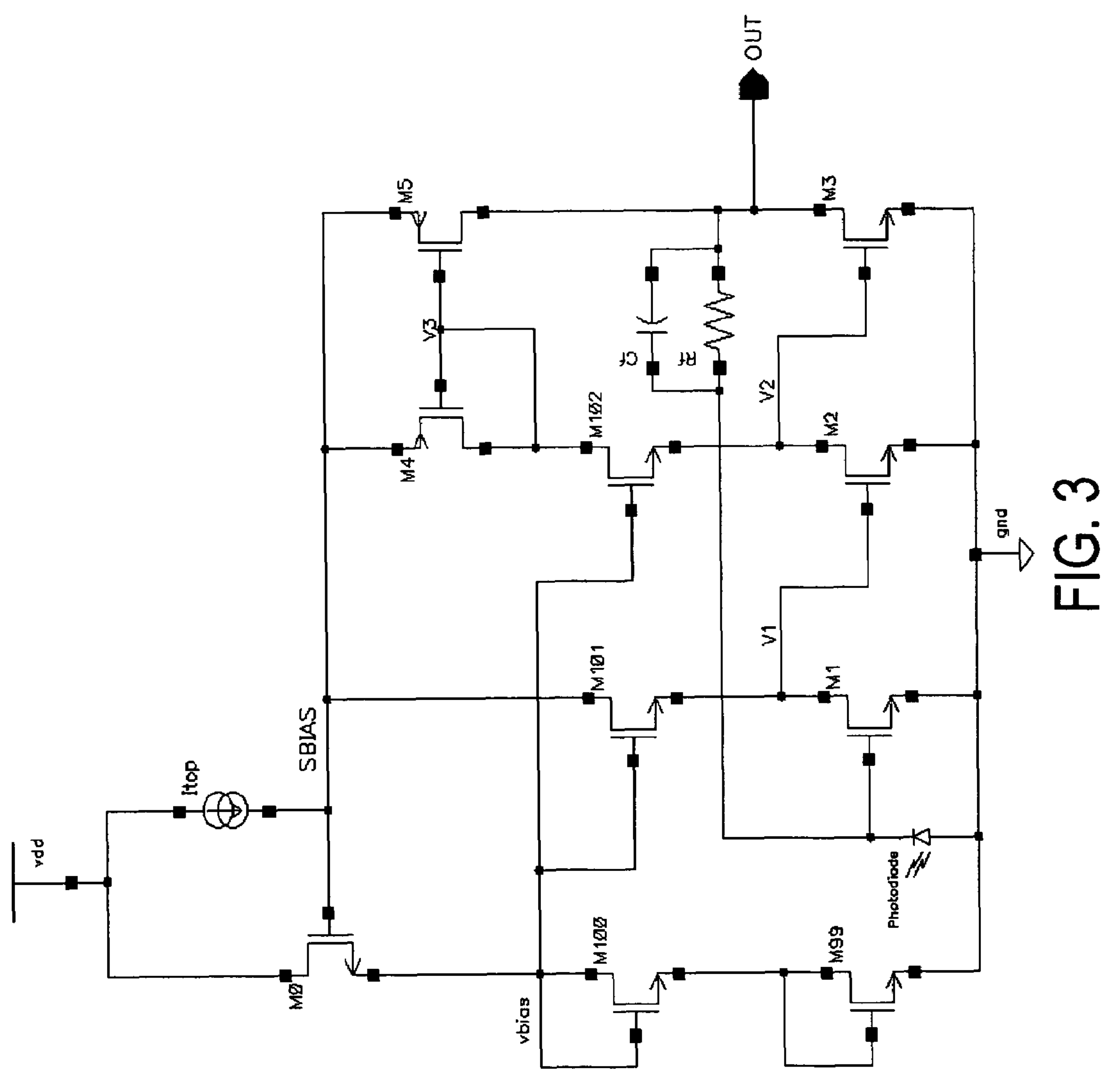
FIG. 3 illustrates an exemplary circuit implementation of the transimpedance amplifier of FIG. 2 according to a second embodiment of the invention.

FIG. 3 illustrates an exemplary circuit implementation of the transimpedance amplifier of FIG. 2 according to one embodiment of the invention. As noted with reference to FIG. 2, the TIA includes a three stage amplifier design that includes a first stage, a second stage, and a third stage. The first stage is implemented with transistor M1 and the load for transistor M1 is implemented with transistor M101. The second stage is implemented with transistor M2 and the load for transistor M2 is implemented with transistor M102. The third stage is implemented with transistor M3, and the load for transistor M3 is implemented with transistor M5.

The first stage includes a gain element (e.g., transistor M1) and a corresponding load (e.g., transistor M101). Similarly, the second stage includes a gain element (e.g., transistor M2) and a corresponding load (e.g., transistor M102). The third stage includes transistor M3 with a load (e.g., transistor M5) that is coupled to a load (not shown), which can be resistive, capacitive or both resistive and capacitive (e.g., $R_L$, $C_L$ or both).

Feedback elements R_f and C_f are coupled between the output node and the input node. Transistors M99 and M100 are utilized to realize the reference signal setting circuit 120. Transistors M99 and M100 can be employed to affect or set the signal at the V_bias node and the S_bias node.

How currents I1, I2, and I3 are established, determined, or set are now described.

Setting Currents I1 and I1

Current I1 and current I2 are set by the V_bias signal (also referred to as the V_cntrl signal) at the V_bias node. The V_bias signal (e.g., a V_bias voltage signal) is determined by the reference signal setting circuit 120. The reference signal setting circuit 120 sets a signal (e.g., the DC voltage level) of the internal supply to the amplifier blocks. In addition, a parallel capacitor shunt device may be provided to act as a low pass filter to reject noise injected to the amplifier from the power supply node.

In this embodiment, the V_bias signal setting circuit 120 is implemented with a stacked diode structure. For example, the stacked diode structure can be a stack of MOS diodes in parallel with a shunt capacitor. In one embodiment, the stacked diode structure includes transistor M100 stacked on transistor M99. It is noted that transistor M99 and transistor M100 each has a drain electrode, a gate electrode and a source electrode. The drain electrode is coupled to the gate electrode for both transistors M99 and M100 to realize two diodes connected in series. It is noted that this can be implemented with other well known circuits that set a V_bias signal (e.g., a V_bias voltage signal).

Determining Current I3

Current I3 is determined by a current mirror that is implemented in this embodiment by transistors M4 and M5. In this embodiment, the transimpedance amplifier 100 includes a circuit topology in which transistor M101 is a load for the first stage 210. Similarly, transistor M102 is a load for the second stage 220. The first gain transistor can be implemented with transistor M1, and the second gain transistor can be implemented with transistor M2. Since the loads are connected above the gain transistors, it is noted that the same current flows through transistor M101 and transistor M1. Similarly, it is noted that the same current flows through transistor M102 and transistor M2. In this regard, the gain of each stage is simply a ratio of the gms of the load transistor and the gain transistor. For example, the gain of the first stage is a ratio of the gain of transistor M101 and the gain of transistor M1. Similarly, the gain of the second stage is a ratio of the gain of transistor M102 and the gain of transistor M2.

Transistor M1, transistor M2, and transistor M3 are amplifying transistors (also referred to herein as gain transistors). Transistor M99 and transistor M100 set the V_bias signal (e.g., a V_bias voltage signal) at the V_bias node for the loads. Transistor M4 and transistor M5 have dual functions. First, transistor M4 and transistor M5 provide a feed-forward path for the amplifier. Second, transistor M4 and transistor M5 also mirror current (e.g., the current through transistor M102) to the third stage 230 (also referred to as the output stage). Transistor M101 and transistor M102 are loads (e.g., diode-connected loads) for transistor M1 and transistor M2, respectively.

Transistor M0 provides a feedback path for the regulator. In one embodiment, the transimpedance feedback element 150 is implemented with a resistor (R_f) in parallel with a capacitor (C_f). Resistor R_f is a feedback element. Capacitor C_f is a compensation capacitor for the transimpedance amplifier. The V_bias signal setting circuit 120 is implemented with a stacked diode structure that includes transistor M99 and transistor M100.

Regulator Operation

According to one embodiment, the regulator 148 operates as follows. When the S_bias signal rises due to a positive transient, for example, transistor M0 senses this rise and in turn causes the V_bias signal to rise. It is noted that transistor M0 acts as an emitter follower, where the source electrode follows the signal at the gate electrode. The rise in the V_bias signal (e.g., the voltage signal at the V_bias node) causes the current through transistor M101 to increase. For example, the drain current through transistor M101 increases, thereby pulling down the signal on the S_bias node. Pulling down on the S_bias rail regulates the signal (e.g., voltage signal) at the S_bias node by correcting or compensating for the rise in the S_bias signal.

The rise in the V_bias signal (e.g., the voltage signal at the V_bias node) also causes the signal (e.g., the gate voltage signal) at the gate electrode of transistor M2 to increase. As the signal at the gate electrode of transistor M2 increases or rises, the current through transistor M2 increases (e.g., the drain current of transistor M2), thereby causing the current through transistor M4 and the current through transistor M5 to increase or rise. The increase of the current through transistors M4 and M5 also compensates for the positive transient by reducing the S_bias signal (e.g., the voltage signal at the S_bias node).

A similar but opposite action occurs for negative transients. For example, when the S_bias signal falls or decreases due to a negative transient, for example, transistor M0 senses this fall or decrease and in turn causes the V_bias signal to decrease or fall. It is noted that transistor M0 acts as an emitter follower, where the source electrode follows the signal at the gate electrode. The fall in the V_bias signal (e.g., the voltage signal at the V_bias node) causes the current through transistor M101 to decrease. For example, the drain current through transistor M101 decreases, thereby increasing the signal on the S_bias node. Increasing the signal on the S_bias rail regulates the signal (e.g., voltage signal) at the S_bias node by correcting or compensating for the fall or decrease in the S_bias signal.

The fall or decrease in the V_bias signal (e.g., the voltage signal at the V_bias node) also causes the signal (e.g., the gate voltage signal) at the gate electrode of transistor M2 to decrease or fall. As the signal at the gate electrode of transistor M2 decreases or falls, the current through transistor decreases (e.g., the drain current of transistor M2), thereby causing the current through transistor M4 and the current through transistor M5 to likewise decrease. The decrease in the current through transistors M4 and M5 also compensates for the negative transient by increasing the S_bias signal (e.g., the voltage signal at the S_bias node).

It is noted that the whole circuit 140 serves to regulate current. The TIA according to the invention serves to regulate its own power supply for supply noise rejection. Stated differently, the current used for supply regulation is also used for signal amplification, thereby resulting in optimal power usage compared with prior art TIAs.

It is further noted that the current branch in each stage is scaled proportional to the ratio of transistors. The current, I_top, supplied by the top current source divides itself according to the driver device sizes, thereby making pole placement of the n-stage amplifier manageable and controllable over different process conditions.

As process technology shrinks, the speed of the circuit improves. When scaled with smaller geometry, a minimum power supply headroom requirement also decreases. This headroom can be adjusted with a level-shift element (e.g., transistor M0). This embodiment ensures ease of design realization independent of process attributes. For example, a low supply voltage can be achieved with this configuration. Stated differently, this embodiment provides for the lowest possible power supply condition required for proper circuit operations.

The TIA according to the invention provides power savings, speed improvements or a combination thereof. At a particular speed, the TIA employs a lower current to achieve the same speed as compared with existing prior art TIA topologies. Since the TIA according to the invention does not require additional regulation circuit, and no current is wasted at each stage since the diode load is not connected to ground, the TIA according to the invention provides increased speed, lower power consumption, and also size saving because no additional power regulation circuitry is required.

Figure 4:
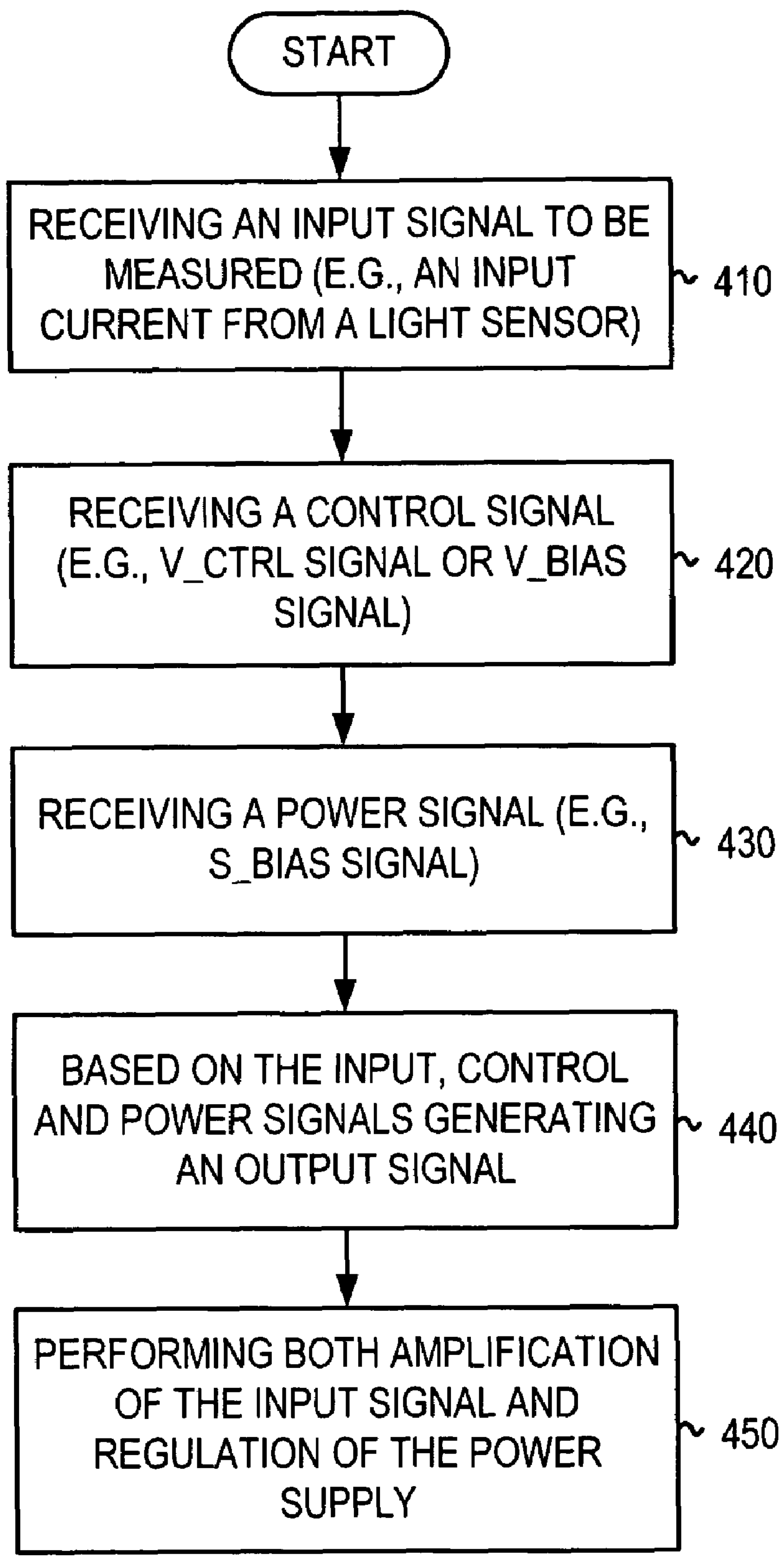
FIG. 4 is a flowchart illustrating a method performed by the transimpedance amplifier according to a one embodiment of the invention.

Processing Performed by the Transimpedance Amplifier with Self-Biased Regulator FIG. 4 is a flowchart illustrating a method performed by the transimpedance amplifier according to a one embodiment of the invention. In step 410, a first input signal (e.g., a current signal generated by a photodetector) to be measured is received by the transimpedance amplifier according to the invention. In step 420, a second input signal is received from a node (e.g., a node of a current source that provides a V_int signal) by the transimpedance amplifier according to the invention. In step 430, a third input signal is received from a node (e.g., a node of a current source that provides a V_cntrl signal) by the trans-impedance amplifier according to the invention. In step 440, based on the first, second and third input signals, the transimpedance amplifier according to the invention generates an output signal. In step 450, the trans-impedance amplifier (e.g., at least one gain stage) is employed to perform both amplification of the input signal and regulation of the power supply (e.g., power supply noise rejection).

Optical Isolation Application

Figure 5:
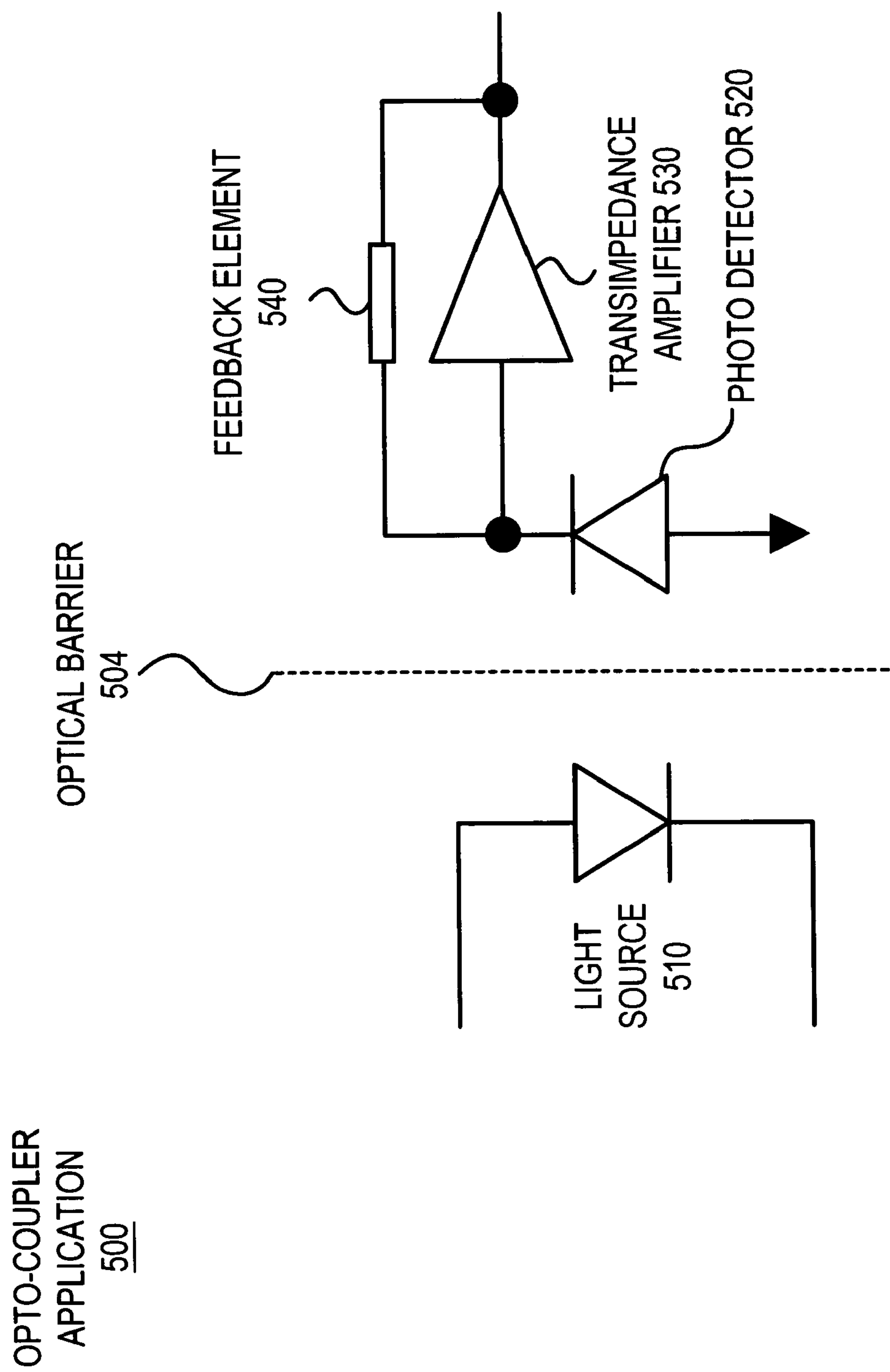
FIG. 5 illustrates a block diagram of an opto-coupler application that can utilize the transimpedance amplifier according to a one embodiment of the invention.

FIG. 5 illustrates a block diagram of an optical isolation application 500 (e.g., opto-coupler application) that can utilize the transimpedance amplifier according to a one embodiment of the invention. The optical isolation application 500 includes an optical barrier that separates a light source 510 and a sensor (e.g., a photodetector or photodiode) 520. The transimpedance amplifier (TIA) 530 according to the invention may be coupled to the sensor 520. A feedback element can be coupled in parallel with the TIA 530.

Optical isolation applications typically have moderate speed performance and moderate to high power dissipation. Optical isolation applications have better safety and isolation performance than magnetic isolation applications, for example. The assignee of the present patent application is a provider of optical isolation products and solutions. The TIA according to the invention enables optical isolation applications to have higher performance (i.e., retain the isolation attributes of the optical channel) with lower power requirements (e.g., power requirements of magnetic isolation solutions).

Photodiode Preamplifier Application

Figure 6:
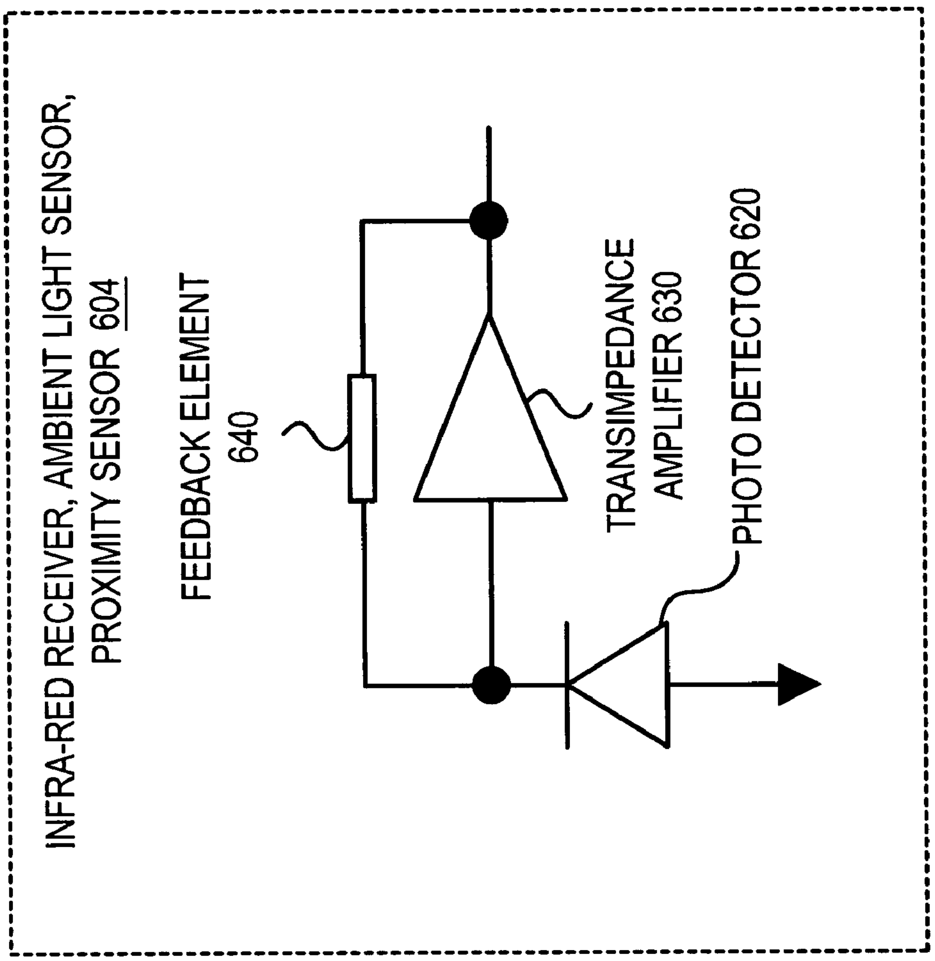
FIG. 6 illustrates a block diagram of a light sensor application that can utilize the transimpedance amplifier according to a one embodiment of the invention.

FIG. 6 illustrates a block diagram of a light sensor application 600 that can utilize the transimpedance amplifier according to a one embodiment of the invention. The light sensor application 500 can be, but is not limited to, an infra-red receiver, ambient light sensor, and a proximity sensor 604. The sensor 620 (e.g., a photodetector or photodiode) is provided to detect the light. The transimpedance amplifier (TIA) 630 according to the invention may be coupled to the sensor 620. A feedback element can be coupled in parallel with the TIA 630. The assignee is a manufacturer of such products and solutions.

Optical Media Application

Figure 7:
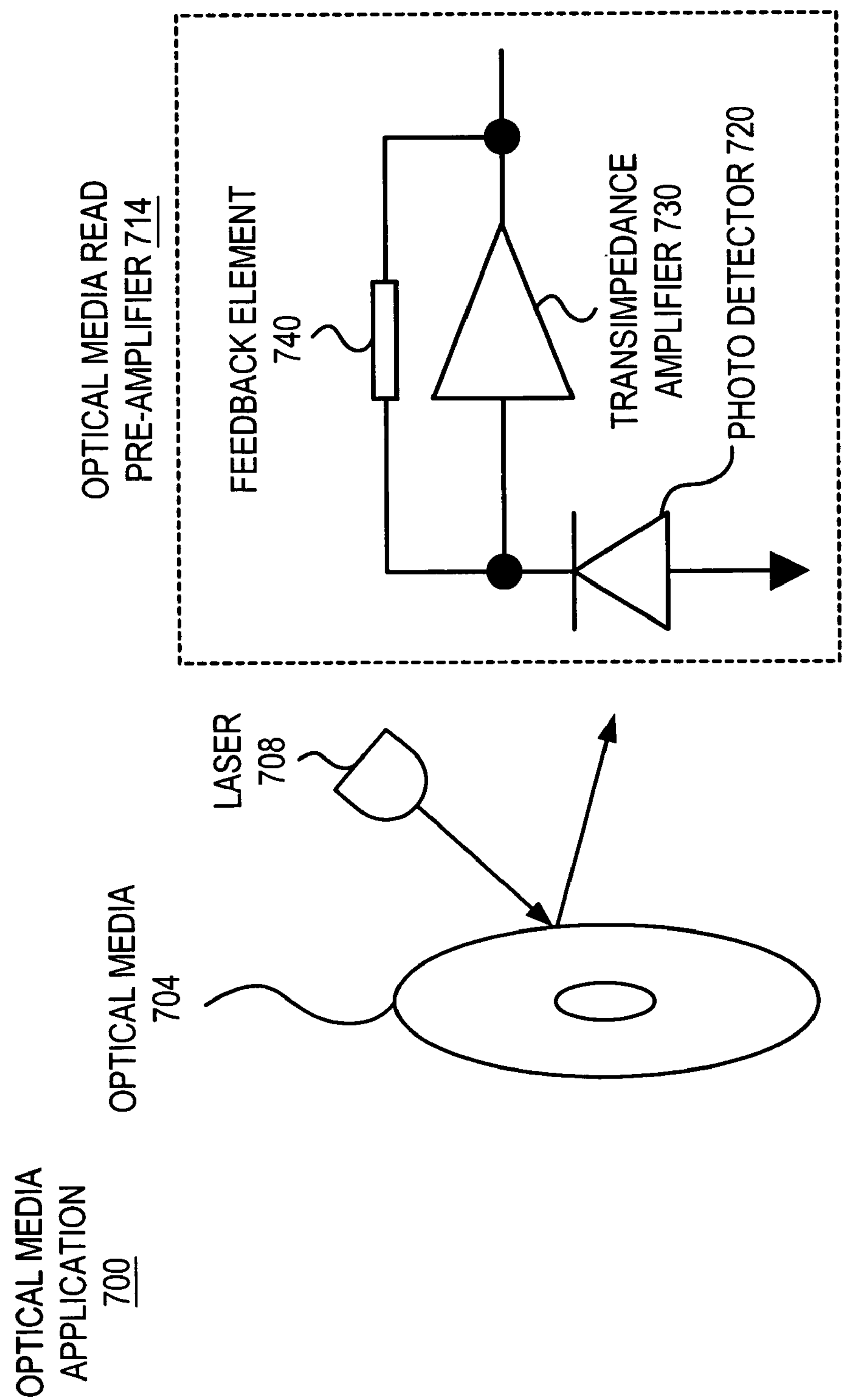
FIG. 7 illustrates a block diagram of an optical media application that can utilize the transimpedance amplifier according to a one embodiment of the invention.

FIG. 7 illustrates a block diagram of an optical media application 700 that can utilize the transimpedance amplifier according to a one embodiment of the invention. The optical media application 700 includes an optical media 704 and a light source (e.g., a laser) 708 that generates light, which impinges on the media 704 and is reflected thereby to a sensor (e.g., a photodetector or photodiode) 720. In one embodiment, the may be implemented in an optical media read pre-amplifier 714. For example, the transimpedance amplifier (TIA) 730 according to the invention may be coupled to the sensor 720. A feedback element 740 can be coupled in parallel with the TIA 730.

The TIA with self-biased regulator according to the invention may be incorporated into a variety of different electronic devices that include, but are not limited to, optocouplers, optical media applications, sensor pre-amplification applications, infrared transceivers, proximity sensors, and optical media applications.

It is noted that the mechanisms (e.g., a mechanism that employs a current source signal for both signal amplification and power signal regulation, mechanism that includes at least one gain stage with a groundless load, and a mechanism that employs at least one gain stage to amplify the input signal and also regulate the power signal by performing power signal noise rejection) according to the invention are not limited to the embodiments and applications described above, but instead can be utilized to perform amplification and regulation functions for other types of applications.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A system comprising:

a light sensor configured to generate an input current signal in response to light energy;

a transimpedance amplifier configured to generate an output signal in response to the input current signal, the transimpedance amplifier comprising a first amplifier stage; and a self-biased regulator configured to vary a current flowing through a transistor of the first amplifier stage resulting thereof in a change of gain of the first amplifier stage and further resulting in a voltage regulation at a bias node of the transimpedance amplifier; and a current source that generates a current, I top; wherein the first amplifier stage utilizes at least a portion of the current for signal amplification; and wherein the self-biased regulator utilizes a portion of the current for the voltage regulation of the bias node of the transimpedance amplifier.

2. The system of claim 1 wherein the transimpedance amplifier comprises a plurality of amplifier stages to provide the output signal in response to the input current signal.

3. The system of claim 2, wherein the transimpedance amplifier further comprises a feed-back circuit to affect an amplification gain between the input current signal and the output signal in response to the output signal.

4. The system of claim 1, wherein the transimpedance amplifier further comprises a reference signal setting circuit that controls the self-biased regulator.

5. The system of claim 1 wherein the light sensor includes one of a photodiode and a photodetector.

6. The system of claim 1 implemented in an optical isolation application.

7. The system of claim 1 implemented in one of a light sensor application and a light sensor pre-amplifier.

8. The system of claim 1 implemented in an optical media application.

9. A transimpedance amplifier, comprising:

a current source configured to provide a supply current to a bias node;

a first amplifier stage comprising a first amplifying transistor and a first load transistor coupled to the bias node such that a first portion of the supply current flows through both transistors, and wherein the first amplifier stage has a stage gain equal to a ratio of the gain of the first load transistor and the gain of the first amplifying transistor; and a power supply regulator circuit comprising a sense transistor configured as an emitter follower with a first electrode coupled to the bias node and a second electrode coupled to the first load transistor whereby a change in voltage at the bias node results in a change of the first portion of the supply current flowing through the first load transistor and the first amplifying transistor thereby resulting in a change of the stage gain of the first amplifier stage and further resulting in a voltage regulation at the bias node.

10. The transimpedance amplifier of claim 9, wherein the sense transistor is a field-effect transistor (FET), the first electrode is a gate electrode of the FET, and the second electrode is a source electrode of the FET.

11. The transimpedance amplifier of claim 9 implemented in one of an optical isolation application, a light sensor application and a light sensor pre-amplifier.

12. The transimpedance amplifier of claim 9 implemented in an optical media application.

13. The transimpedance amplifier of claim 9, further comprising:

a second amplifier stage comprising a second amplifying transistor and a second load transistor coupled to the bias node such that a second portion of the supply current flows through both transistors, and wherein the second amplifier stage has a stage gain equal to a ratio of the gain of the second load transistor and the gain of the second amplifying transistor.

14. The transimpedance amplifier of claim 13, further comprising:

a third amplifier stage comprising a third amplifying transistor and a third load transistor coupled to the bias node such that a third portion of the supply current flows through both transistors, wherein the third amplifier stage has a stage gain equal to a ratio of the gain of the third load transistor and the gain of the third amplifying transistor; and a current mirror circuit comprising the third load transistor and a fourth transistor that is a part of the second amplifier stage.

15. A method for transimpedance amplification, the method comprising:

providing a transimpedance amplifier;

receiving an input current signal in the transimpedance amplifier;

generating a control signal in the transimpedance amplifier; and using the control signal to provide power supply regulation by controlling an amplification gain of the transimpedance amplifier.

16. The method of claim 15, wherein providing the transimpedance amplifier comprises:

providing a current source configured to provide a supply current to a bias node; and providing a first amplifier stage comprising a first amplifying transistor and a first load transistor coupled to the bias node such that a first portion of the supply current flows through both transistors, and wherein the first amplifier stage has a stage gain equal to a ratio of the gain of the first load transistor and the gain of the first amplifying transistor.

17. The method of claim 16, wherein generating the control signal comprises:

providing a sense transistor configured as an emitter follower with a gate electrode coupled to the bias node and a source electrode coupled to the first load transistor, whereby a change in voltage at the bias node results in a change of the first portion of the supply current flowing trough the first load transistor and the first amplifying transistor thereby resulting in a change of the stage gain of the first amplifier stage and further resulting in a power supply regulation at the bias node.

* * * * *

UNITED STATES PATENT AND TRADEMARK OFFICE

CERTIFICATE OF CORRECTION

PATENT NO. : 7,265,631 B2
APPLICATION NO. : 11/078539
DATED : September 4, 2007
INVENTOR(S) : Hock Kwa It is certified that error appears in the above-identified patent and that said Letters Patent is hereby corrected as shown below:

Col. 10 Line 32 In Claim 17, delete "trough" and insert -- through --, therefor.

Signed and Sealed this

Seventeenth Day of February, 2009

JOHN DOLL
*Acting Director of the United States Patent and Trademark Office*